(12) United States Patent
Park et al.

(10) Patent No.: US 12,283,323 B2
(45) Date of Patent: Apr. 22, 2025

(54) MEMORY DEVICE AND METHOD OF OPERATION WITH SEQUENTIAL DISCHARGING OF WORD LINES

(71) Applicant: SK hynix Inc., Icheon-si (KR)

(72) Inventors: Sung Kun Park, Icheon-si (KR); Myoung Kwan Cho, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 259 days.

(21) Appl. No.: 17/889,970

(22) Filed: Aug. 17, 2022

(65) Prior Publication Data

US 2023/0317168 A1 Oct. 5, 2023

(30) Foreign Application Priority Data

Mar. 25, 2022 (KR) ........................ 10-2022-0037659

(51) Int. Cl.
| | |
|---|---|
| G11C 16/08 | (2006.01) |
| G11C 16/04 | (2006.01) |
| G11C 16/10 | (2006.01) |
| G11C 16/26 | (2006.01) |

(52) U.S. Cl.
CPC .......... *G11C 16/08* (2013.01); *G11C 16/0425* (2013.01); *G11C 16/102* (2013.01); *G11C 16/26* (2013.01)

(58) Field of Classification Search
CPC ... G11C 16/08; G11C 16/0425; G11C 16/102; G11C 16/26; G11C 16/10; G11C 16/32; G11C 16/3418; G11C 16/0483; G11C 16/12; G11C 16/24; G11C 16/34; G11C 16/3404; G11C 11/5628; G11C 11/5642
See application file for complete search history.

(56) References Cited

U.S. PATENT DOCUMENTS

| | | | |
|---|---|---|---|
| 8,422,308 B2 * | 4/2013 | Chung | G11C 8/10 |
| | | | 365/185.11 |
| 2008/0316830 A1 * | 12/2008 | Yang | G11C 16/30 |
| | | | 365/185.18 |
| 2011/0090744 A1 * | 4/2011 | Cho | G11C 16/32 |
| | | | 365/185.25 |

(Continued)

FOREIGN PATENT DOCUMENTS

| | | |
|---|---|---|
| KR | 1020150001400 A | 1/2015 |
| KR | 1020180099018 A | 9/2018 |

*Primary Examiner* — Sultana Begum
(74) *Attorney, Agent, or Firm* — WILLIAM PARK & ASSOCIATES LTD.

(57) ABSTRACT

Provided herein may be a memory device and a method of operating the same. The memory device may include a memory cell string including a plurality of memory cells coupled to a plurality of word lines, a peripheral circuit configured to perform an operation that applies an operating voltage to a selected word line and applying a pass voltage to unselected word lines, among the plurality of word lines, and an operation controller configured to control the peripheral circuit to perform, after the operation has been performed, a discharge operation that sequentially decreases voltages of the plurality of word lines that range from at least one central word line located in a central portion in relation to the memory cell string to a word line, among the plurality of word lines, located in an outermost portion in relation to the memory cell string, adjacent to a select line.

18 Claims, 14 Drawing Sheets

(56) References Cited

U.S. PATENT DOCUMENTS

| | | | |
|---|---|---|---|
| 2019/0377632 A1* | 12/2019 | Oh | G06F 11/076 |
| 2021/0327513 A1* | 10/2021 | Hwang | G11C 16/14 |
| 2023/0091024 A1* | 3/2023 | Okuyama | G11C 16/32 |
| | | | 365/185.18 |

* cited by examiner

MEMORY DEVICE AND METHOD OF OPERATION WITH SEQUENTIAL DISCHARGING OF WORD LINES

CROSS-REFERENCE TO RELATED APPLICATION

The present application claims priority under 35 U.S.C. § 119(a) to Korean patent application number 10-2022-0037659 filed on Mar. 25, 2022, in the Korean Intellectual Property Office, the entire disclosure of which is incorporated by reference herein.

BACKGROUND

1. Technical Field

Various embodiments of the present disclosure relate to an electronic device, and more particularly to a memory device and a method of operating the memory device.

2. Related Art

A memory device is a storage device implemented using a semiconductor, such as silicon (Si), germanium (Ge), gallium arsenide (GaAs), or indium phosphide (InP). Memory devices are basically classified into a volatile memory device and a nonvolatile memory device.

The volatile memory device is a memory device in which stored data is lost when power supply is interrupted. Representative examples of the volatile memory device include a static random access memory (SRAM), a dynamic RAM (DRAM), and a synchronous DRAM (SDRAM). The nonvolatile memory device is a memory device in which stored data is retained even when power supply is interrupted. Representative examples of the nonvolatile memory device include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), and a ferroelectric RAM (FRAM). The flash memory is roughly classified into a NOR type and a NAND type.

SUMMARY

An embodiment of the present disclosure may provide for a memory device. The memory device may include a memory cell string including a plurality of memory cells coupled to a plurality of word lines, a peripheral circuit configured to perform an operation that applies an operating voltage to a selected word line, among the plurality of word lines, and applying a pass voltage to unselected word lines, among the plurality of word lines, and an operation controller configured to control the peripheral circuit to perform, after the operation has been performed, a discharge operation that sequentially decreases voltages of the plurality of word lines that range from at least one central word line, among the plurality of word lines, located in a central portion in relation to the memory cell string to a word line, among the plurality of word lines, located in an outermost portion in relation to the memory cell string, adjacent to a select line.

An embodiment of the present disclosure may provide for a method of operating a memory device. The method may include applying an operating voltage to a selected word line, among a plurality of word lines that are coupled to a plurality of memory cells included in a memory cell string, performing an operation that applies a pass voltage to unselected word lines, among the plurality of word lines, and performing, after the operation has been performed, a discharge operation that sequentially decreases voltages of the plurality of word lines that range from at least one central word line, among the plurality of word lines, located in a central portion in relation to the memory cell string to a word line, among the plurality of word lines, located in an outermost portion in relation to the memory cell string, adjacent to a select line.

DETAILED DESCRIPTION

Specific structural or functional descriptions in the embodiments of the present disclosure introduced in this specification or application are exemplified to describe embodiments according to the concept of the present disclosure. The embodiments according to the concept of the present disclosure may be practiced in various forms and should not be construed as being limited to the embodiments described in the specification or application.

Various embodiments of the present disclosure are directed to a memory device that is capable of improving negative boosting during a word line discharge operation, and a method of operating the memory device.

Figure 1:
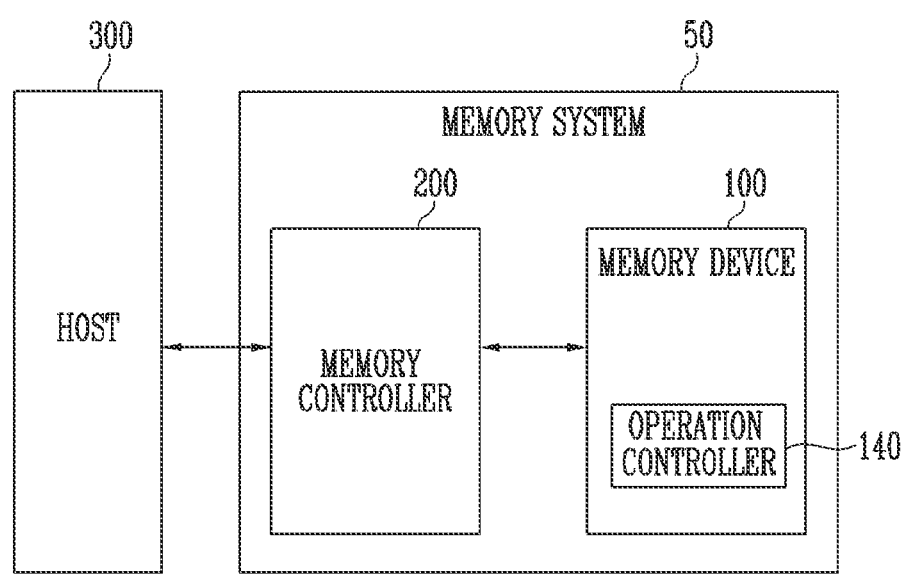
FIG. 1 is a diagram illustrating a memory system including a memory device according to an embodiment of the present disclosure.

FIG. 1 is a diagram illustrating a memory system including a memory device according to an embodiment of the present disclosure.

Referring to FIG. 1, a memory system 50 may include a memory device 100 and a memory controller 200. The memory system 50 may be a device, which stores data under the control of a host 300, such as a mobile phone, a smartphone, an MP3 player, a laptop computer, a desktop computer, a game console, a TV, a tablet PC, or an in-vehicle infotainment system.

The memory system 50 may be manufactured as any one of various types of storage devices based on a host interface that is a scheme for communicating with the host 300. For example, the memory system 50 may be implemented as any one of various types of storage devices, for example, a solid state disk (SSD), a multimedia card such as an MMC, an embedded MMC (eMMC), a reduced size MMC (RS-MMC), or a micro-MMC, a secure digital card such as an SD, a mini-SD, or a micro-SD, a universal serial bus (USB) storage device, a universal flash storage (UFS) device, a personal computer memory card international association (PCMCIA) card-type storage device, a peripheral component interconnection (PCI)-card type storage device, a PCI express (PCI-E) card-type storage device, a compact flash (CF) card, a smart media card, and a memory stick.

The memory system 50 may be manufactured in any one of various types of package forms. For example, the memory system 50 may be manufactured in any one of various types of package forms, such as package on package (POP), system in package (SIP), system on chip (SOC), multi-chip package (MCP), chip on board (COB), wafer-level fabricated package (WFP), and wafer-level stack package (WSP).

The memory device 100 may store data. The memory device 100 may be operated based on the memory controller 200. The memory device 100 may include a memory cell array (not illustrated) including a plurality of memory cells that store data.

Each of the memory cells may be implemented as a single-level cell (SLC) capable of storing one bit of data, a multi-level cell (MLC) capable of storing two bits of data, a triple-level cell (TLC) capable of storing three bits of data, or a quad-level cell (QLC) capable of storing four bits of data.

The memory cell array (not illustrated) may include a plurality of memory blocks. Each memory block may include a plurality of memory cells. A single memory block may include a plurality of pages. In an embodiment, a page may be a unit by which data is stored in the memory device 100 or by which data that is stored in the memory device 100 is read. A memory block may be a unit by which data is erased.

In an embodiment, the memory device 100 may be implemented as a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory device, a resistive RAM (RRAM), a phase-change RAM (PRAM), a magnetoresistive RAM (MRAM), a ferroelectric RAM (FRAM), or a spin transfer torque RAM (STT-RAM). In the present specification, for convenience of description, a description is made on the assumption that the memory device 100 is a NAND flash memory.

The memory device 100 may receive a command and an address from the memory controller 200 and may access the area of the memory cell array that is selected by the address. The memory device 100 may perform an operation that is indicated by the command on the area that is selected by the address. For example, the memory device 100 may perform a write operation (i.e., a program operation), a read operation, and an erase operation. During a write operation, the memory device 100 may program data to the area that is selected by the address. During a read operation, the memory device 100 may read data from the area that is selected by the address. During an erase operation, the memory device 100 may erase data that is stored in the area that is selected by the address.

In an embodiment, the memory device 100 may include an operation controller 140.

The operation controller 140 may control a program operation and a read operation that are performed on memory cells. The program operation may be an operation of storing data in the memory cells. In detail, the program operation may be an operation of increasing the threshold voltages of memory cells based on the data to be stored in the memory cells. When the program operation is performed, each of the memory cells may have a threshold voltage corresponding to any one of a plurality of program states. The plurality of program states may be designated based on the number of data bits that are stored in one memory cell. For example, when data is programmed according to a triple-level cell (TLC) scheme in which three bits of data are stored in one memory cell, the plurality of program states may indicate an erased state and first to seventh program states. After the program operation has been performed, threshold voltages of the memory cells may be determined based on data to be stored in the memory cells. Each of the memory cells may have any one of the plurality of program states as a target program state based on the data to be stored in the corresponding memory cell.

In an embodiment, the program operation may include a plurality of program loops. Each program loop may include a program voltage apply operation and a verify operation. The program voltage apply operation may be an operation of increasing threshold voltages of memory cells by using a program voltage. The verify operation may be an operation that identifies, by using a verify voltage, whether the threshold voltage of each memory cell has reached a threshold voltage corresponding to a target program state.

In an embodiment, the read operation may be an operation that applies a read voltage to a word line that is coupled to the memory cells and senses data that is stored in the memory cells. The read operation may be an operation that acquires data that is stored in the memory cells. Since the threshold voltages of the memory cells are determined based on the stored data, the read operation may be an operation that identifies program states corresponding to the threshold voltages of the memory cells, among a plurality of program states. For example, when the memory cells are programmed according to a TLC scheme, seven read voltages may be applied to identify which of an erased state and first to seventh program states corresponds to each of the threshold voltages of the memory cells.

In an embodiment, the operation controller 140 may control a discharge operation included in each of a program operation and a read operation. The discharge operation may be an operation that decreases the voltages of word lines. For example, the operation controller 140 may perform a discharge operation that decreases the voltages that are applied to the plurality of word lines to a ground voltage during the program operation and the read operation. In detail, the operation controller 140 may decrease a program voltage, a verify voltage, a verify pass voltage, and a program pass voltage that are applied to the plurality of word lines to the ground voltage during the program operation. The operation controller 140 may decrease a read voltage and a read pass voltage that are applied to the plurality of word lines to the ground voltage during the read operation.

The memory controller 200 may control the overall operation of the memory system 50.

When power is applied to the memory system 50, the memory controller 200 may run firmware (FW). When the memory device 100 is a flash memory device, the firmware (FW) may include a host interface layer (HIL) that controls communication with the host 300, a flash translation layer (FTL) that controls communication between the host 300 and the memory device 100, and a flash interface layer (FIL) that controls communication with the memory device 100.

In an embodiment, the memory controller 200 may receive data and a logical block address (LBA) from the host 300 and may translate the logical block address (LBA) into a physical block address (PBA), indicating the address of memory cells that are included in the memory device 100 and in which data is to be stored. In the present specification, the terms "logical block address (LBA)" and "logical address" may be used interchangeably. In the present specification, the terms "physical block address (PBA)" and "physical address" may be used interchangeably.

The memory controller 200 may control the memory device 100 so that a write operation, a read operation, or an erase operation is performed in response to a request received from the host 300. During a write operation, the memory controller 200 may provide a write command, a physical block address, and data to the memory device 100. During a read operation, the memory controller 200 may provide a read command and a physical block address to the memory device 100. During an erase operation, the memory controller 200 may provide an erase command and a physical block address to the memory device 100.

In an embodiment, the memory controller 200 may autonomously generate a command, an address, and data, regardless of whether a request from the host 300 is received, and the memory controller 200 may transmit the command, the address, and the data to the memory device 100. For example, the memory controller 200 may provide the memory device 100 with commands, addresses, and data that are required to perform read operations and write operations that are involved in performing wear leveling, read reclaim, garbage collection, etc.

In an embodiment, the memory controller 200 may control at least two memory devices 100. In this case, the memory controller 200 may control the memory devices 100 through an interleaving scheme to improve operating performance. The interleaving scheme may be a scheme for controlling the memory devices 100 so that the operations of at least two memory devices 100 overlap each other.

The host 300 may communicate with the memory system 50 by using at least one of various communication methods, such as universal serial bus (USB), Serial AT Attachment (SATA), serial attached SCSI (SAS), high speed interchip (HSIC), small computer system interface (SCSI), peripheral component interconnection (PCI), PCI express (PCIe), non-volatile memory express (NVMe), universal flash storage (UFS), secure digital (SD), multimedia card (MMC), embedded MMC (eMMC), dual in-line memory module (DIMM), registered DIMM (RDIMM), and load reduced DIMM (LRDIMM) communication methods.

Figure 2:
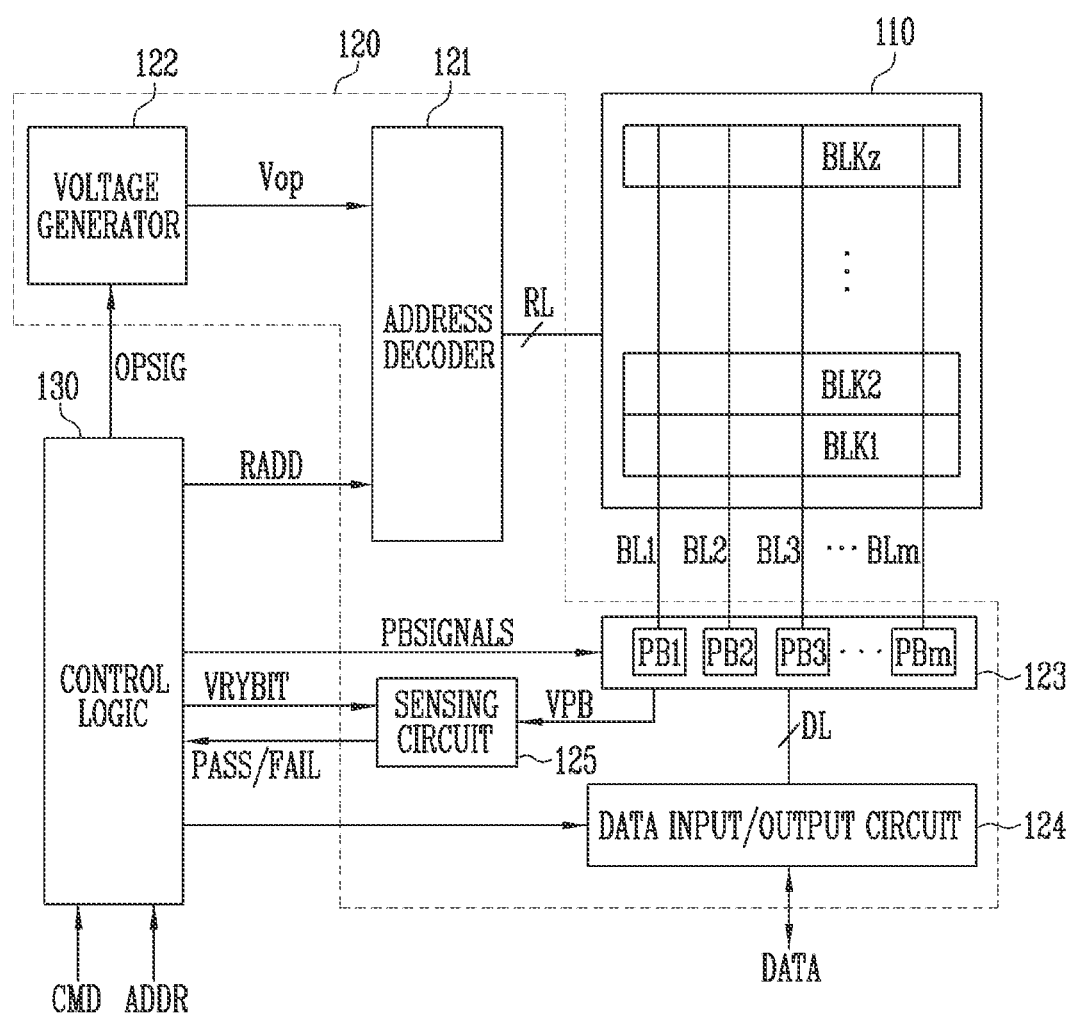
FIG. 2 is a diagram illustrating the structure of the memory device of FIG. 1.

FIG. 2 is a diagram illustrating the structure of the memory device of FIG. 1.

Referring to FIG. 2, the memory device 100 may include a memory cell array 110, a peripheral circuit 120, and a control logic 130.

The memory cell array 110 may include a plurality of memory blocks BLK1 to BLKz. The plurality of memory blocks BLK1 to BLKz may be coupled to an address decoder 121 through row lines RL. The memory blocks BLK1 to BLKz may be coupled to a page buffer group 123 through bit lines BL1 to BLm. Each of the memory blocks BLK1 to BLKz may include a plurality of memory cells. In an embodiment, the plurality of memory cells may be nonvolatile memory cells. Memory cells, among the plurality of memory cells, coupled to the same word line, are defined as one page. In other words, the memory cell array 110 may include a plurality of pages. In an embodiment of the present disclosure, each of the memory blocks BLK1 to BLKz, included in the memory cell array 110, may include a plurality of dummy cells. For the dummy cells, one or more dummy cells may be coupled, in series, between a drain select transistor and memory cells and between a source select transistor and the memory cells.

Each of the memory cells of the memory device 100 may be implemented as a single-level cell (SLC) capable of storing one bit of data, a multi-level cell (MLC) capable of storing two bits of data, a triple-level cell (TLC) capable of storing three bits of data, or a quad-level cell (QLC) capable of storing four bits of data.

The peripheral circuit 120 may drive the memory cell array 110. In an example, the peripheral circuit 120 may drive the memory cell array 110 so that a program operation, a read operation, and an erase operation are performed under the control of the control logic 130. In other examples, the peripheral circuit 120 may apply various driving voltages Vop to the row lines RL and the bit lines BL1 to BLm or may discharge the applied voltages under the control of the control logic 130.

The peripheral circuit 120 may include the address decoder 121, a voltage generator 122, the page buffer group 123, a data input/output circuit 124, and a sensing circuit 125.

The address decoder 121 may be coupled to the memory cell array 110 through the row lines RL. The row lines RL may include drain select lines, word lines, source selection lines, and a common source line. In accordance with an embodiment of the present disclosure, the word lines may include normal word lines and dummy word lines. In accordance with an embodiment, the row lines RL may further include a pipe select line.

The address decoder 121 may be operated under the control of the control logic 130. The address decoder 121 may receive addresses from the control logic 130.

The address decoder 121 may decode a block address, among the received addresses. The address decoder 121 may select at least one of the memory blocks BLK1 to BLKz according to the decoded block address. The address decoder 121 may decode a row address RADD, among the received addresses. The address decoder 121 may select at least one word line of the selected memory block by applying voltages that are supplied from the voltage generator 122 to the at least one word line according to the decoded row address RADD.

During a program operation, the address decoder 121 may apply a program voltage to the selected word line and may apply a pass voltage having a lower voltage level than the program voltage to unselected word lines. During a program verify operation, the address decoder 121 may apply a verify voltage to the selected word line and may apply a verify pass voltage having a higher voltage level than the verify voltage to unselected word lines.

During a read operation, the address decoder 121 may apply a read voltage to the selected word line and may apply a read pass voltage having a higher voltage level than the read voltage to unselected word lines.

The erase operation of the memory device 100 may be performed on a memory block basis. During the erase operation, the addresses ADDR that is input to the memory device 100 may include a block address. The address decoder 121 may decode the block address and select one memory block according to the decoded block address. During the erase operation, the address decoder 121 may apply a ground voltage to word lines that are coupled to the selected memory block.

The address decoder 121 may decode a column address, among the received addresses ADDR. The decoded column address may be transferred to the page buffer group 123. In an embodiment, the address decoder 121 may include components, such as a row decoder, a column decoder, and an address buffer.

The voltage generator 122 may generate a plurality of driving voltages Vop by using an external supply voltage that is supplied to the memory device 100. The voltage generator 122 may be operated under the control of the control logic 130.

In an embodiment, the voltage generator 122 may generate an internal supply voltage by regulating the external supply voltage. The internal supply voltage that is generated by the voltage generator 122 may be used as a driving voltage for the memory device 100.

In an embodiment, the voltage generator 122 may generate various driving voltages Vop that are used for program, read, and erase operations in response to an operation signal OPSIG. The voltage generator 122 may generate the plurality of driving voltages Vop by using the external supply voltage or the internal supply voltage. The voltage generator 122 may generate various voltages that are required by the memory device 100. For example, the voltage generator 122 may generate a plurality of erase voltages, a plurality of program voltages, a plurality of program pass voltages, a plurality of read voltages, and a plurality of read pass voltages.

The voltage generator 122 may include a plurality of pumping capacitors that receive the internal supply voltage to generate a plurality of driving voltages Vop having various voltage levels and may generate the plurality of driving voltages Vop by selectively enabling the plurality of pumping capacitors under the control of the control logic 130.

The generated driving voltages Vop may be supplied to the memory cell array 110 by the address decoder 121.

The page buffer group 123 includes first to m-th page buffers PB1 to PBm. The first to m-th page buffers PB1 to PBm are coupled to the memory cell array 110 through the first to m-th bit lines BL1 to BLm, respectively. The first to m-th page buffers PB1 to PBm are operated under the control of the control logic 130.

The first to m-th page buffers PB1 to PBm may transmit/receive data DATA to/from the data input/output circuit 124. During a program operation, the first to m-th page buffers PB1 to PBm may receive data DATA to be stored through the data input/output circuit 124 and data lines DL.

During a program operation, when a program pulse is applied to a selected word line, the first to m-th page buffers PB1 to PBm may transfer the data DATA to be stored, received through the data input/output circuit 124, to selected memory cells through the bit lines BL1 to BLm. The memory cells in the selected page may be programmed based on the received data DATA. Memory cells that are coupled to a bit line to which a program-enable voltage (e.g., a ground voltage) is applied may have increased threshold voltages. The threshold voltages of memory cells that are coupled to a bit line to which a program-inhibit voltage (e.g., a supply voltage) is applied may be maintained. During a program verify operation, the first to m-th page buffers PB1 to PBm may read the data DATA that is stored in the selected memory cells from the selected memory cells through the bit lines BL1 to BLm.

During a read operation, the page buffer group 123 may read data DATA from the memory cells in the selected page through the bit lines BL1 to BLm and may store the read data DATA in the first to m-th page buffers PB1 to PBm.

During an erase operation, the page buffer group 123 may allow the bit lines BL1 to BLm to float. In an embodiment, the page buffer group 123 may include a column select circuit.

In an embodiment, while pieces of data that are stored in some of the plurality of page buffers that are included in the page buffer group 123 are being programmed to the memory cell array 110, the remaining page buffers may receive new data from the memory controller 200 and then may store the new data.

The data input/output circuit 124 may be coupled to the first to m-th page buffers PB1 to PBm through the data lines DL. The data input/output circuit 124 may be operated in response to the control of the control logic 130.

The data input/output circuit 124 may include a plurality of input/output buffers (not illustrated) that receive input data DATA. During a program operation, the data input/output circuit 124 may receive the data DATA to be stored from an external controller (not illustrated). During a read operation, the data input/output circuit 124 may output the data DATA, received from the first to m-th page buffers PB1 to PBm that are included in the page buffer group 123, to the external controller.

During a read operation or a verify operation, the sensing circuit 125 may generate a reference current in response to an enable bit signal VRYBIT that is generated by the control logic 130 and may output a pass signal or a fail signal to the control logic 130 by comparing a sensing voltage VPB that is received from the page buffer group 123 with a reference voltage that is generated by the reference current. In an example, the sensing circuit 125 may output a pass signal to the control logic 130 when the magnitude of the sensing voltage VPB is less than that of the reference voltage. In an example, the sensing circuit 125 may output a fail signal to the control logic 130 when the magnitude of the sensing voltage VPB is less than that of the reference voltage.

The control logic 130 may be coupled to the address decoder 121, the voltage generator 122, the page buffer group 123, the data input/output circuit 124, and the sensing circuit 125. The control logic 130 may control the overall operation of the memory device 100. The control logic 130 may be operated in response to a command CMD that is transferred from an external device.

The control circuit 130 may control the peripheral circuit 120 by generating various types of signals in response to the command CMD and the addresses ADDR. For example, the control logic 130 may generate the operation signal OPSIG, the row address RADD, page buffer control signals PBSIGNALS, and the enable bit VRYBIT in response to the command CMD and the addresses ADDR. The control logic 130 may output the operation signal OPSIG to the voltage generator 122, output the row address RADD to the address decoder 121, output the page buffer control signals PBSIGNALS to the page buffer group 123, and output the enable bit VRYBIT to the sensing circuit 125. In addition, the control logic 130 may determine a verify operation has passed or failed in response to the pass or fail signal PASS/FAIL that is output from the sensing circuit 125.

The operation controller 140, illustrated in FIG. 1, may be included in the control logic 130, illustrated in FIG. 2.

The operation controller 140 may control the peripheral circuit 120 to apply driving voltages Vop to be used in a program operation and a read operation to the row lines RL and the bit lines BL1 to BLm. In an example, during the program operation, the operation controller 140 may control the peripheral circuit 120 to apply the program voltage, the verify voltage, the program pass voltage, and the verify pass voltage to the plurality of word lines. In an example, during the read operation, the operation controller 140 may control the peripheral circuit 120 to apply the read voltage and the read pass voltage to the plurality of word lines. In an embodiment, during the program operation and the read operation, the operation controller 140 may control the peripheral circuit 120 to change the magnitudes of voltages of the plurality of word lines. For example, after the verify voltage, the verify pass voltage, the read voltage, and the read pass voltage are applied to the plurality of word lines, the operation controller 140 may control the peripheral circuit 120 to apply the ground voltage to the plurality of word lines.

More specifically, the operation controller 140 may control the voltage generator 122 to generate the driving voltages Vop to be used for the program operation and the read operation. Thereafter, the voltage generator 122 may provide the generated driving voltages Vop to the address decoder 121. The address decoder 121 may transfer the driving voltages Vop to the plurality of word lines. During the program operation and the read operation, the magnitudes of voltages of the plurality of word lines may be changed based on the magnitudes of the driving voltages Vop that are provided by the address decoder 121. In detail, the magnitudes of voltages of the plurality of word lines may be changed based on the driving voltages Vop that are applied in the program operation and the read operation.

Figure 3:
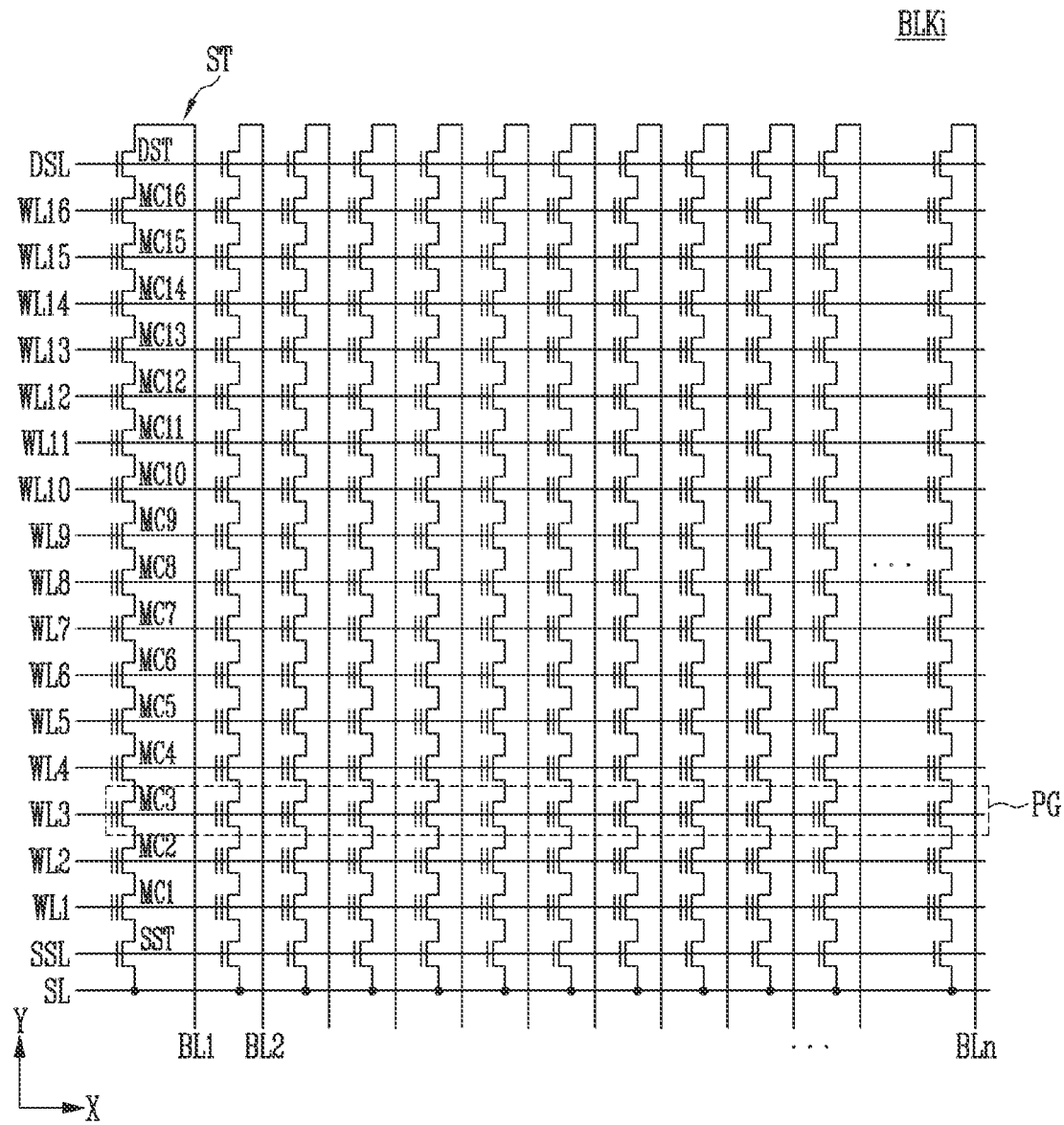
FIG. 3 is a diagram illustrating the structure of any one of a plurality of memory blocks BLK1 to BLKz of FIG. 2.

FIG. 3 is a diagram illustrating the structure of any one of the plurality of memory blocks BLK1 to BLKz of FIG. 2.

A memory block BLKi may indicate any one memory block BLKi, among the memory blocks BLK1 to BLKz, illustrated in FIG. 2.

Referring to FIG. 3, a plurality of word lines that are arranged in parallel to each other may be coupled between a first select line and a second select line. Here, the first select line may be a source select line SSL, and the second select line may be a drain select line DSL. In detail, the memory block BLKi may include a plurality of memory cell strings ST that are coupled between bit lines BL1 to BLn and a source line SL. The bit lines BL1 to BLn may be coupled to the memory cell strings ST, respectively, and the source line SL may be coupled in common to the memory cell strings ST. The strings ST may be equally configured, and thus, the memory cell string ST that is coupled to the first bit line BL1 will be described in detail by way of example.

The memory cell string ST may include a source select transistor SST, a plurality of memory cells MC1 to MC16, and a drain select transistor DST that are coupled in series to each other between the source line SL and the first bit line BL1. A single memory cell string ST may include at least one source select transistor SST and at least one drain select transistor DST and may include more memory cells than the memory cells MC1 to MC16 that are illustrated in the drawing.

A source of the source select transistor SST may be coupled to the source line SL, and a drain of the drain select transistor DST may be coupled to the first bit line BL1. The memory cells MC1 to MC16 may be coupled in series between the source select transistor SST and the drain select transistor DST. Gates of the source select transistors SST that are included in different memory cell strings ST may be coupled to the source select line SSL, gates of the drain select transistors DST that are included in different memory cell strings ST may be coupled to the drain select line DSL, and gates of the memory cells MC1 to MC16 may be coupled to a plurality of word lines WL1 to WL16, respectively. A group of memory cells that are coupled to the same word line, among the memory cells that are included in different memory cell strings ST, may be referred to as a 'physical page (PG)'. Therefore, the memory block BLKi may include a number of physical pages (PG) that are identical to the number of word lines WL1 to WL16.

One memory cell may store one bit of data. This cell is typically designated as a "single-level cell (SLC)". In this case, one physical page (PG) may store data corresponding to one logical page (LPG). The data corresponding to one logical page (LPG) may include a number of data bits that is identical to the number of cells that are included in one physical page (PG).

One memory cell may store two or more bits of data. In this case, one physical page (PG) may store data corresponding to two or more logical pages (LPG).

Figure 4:
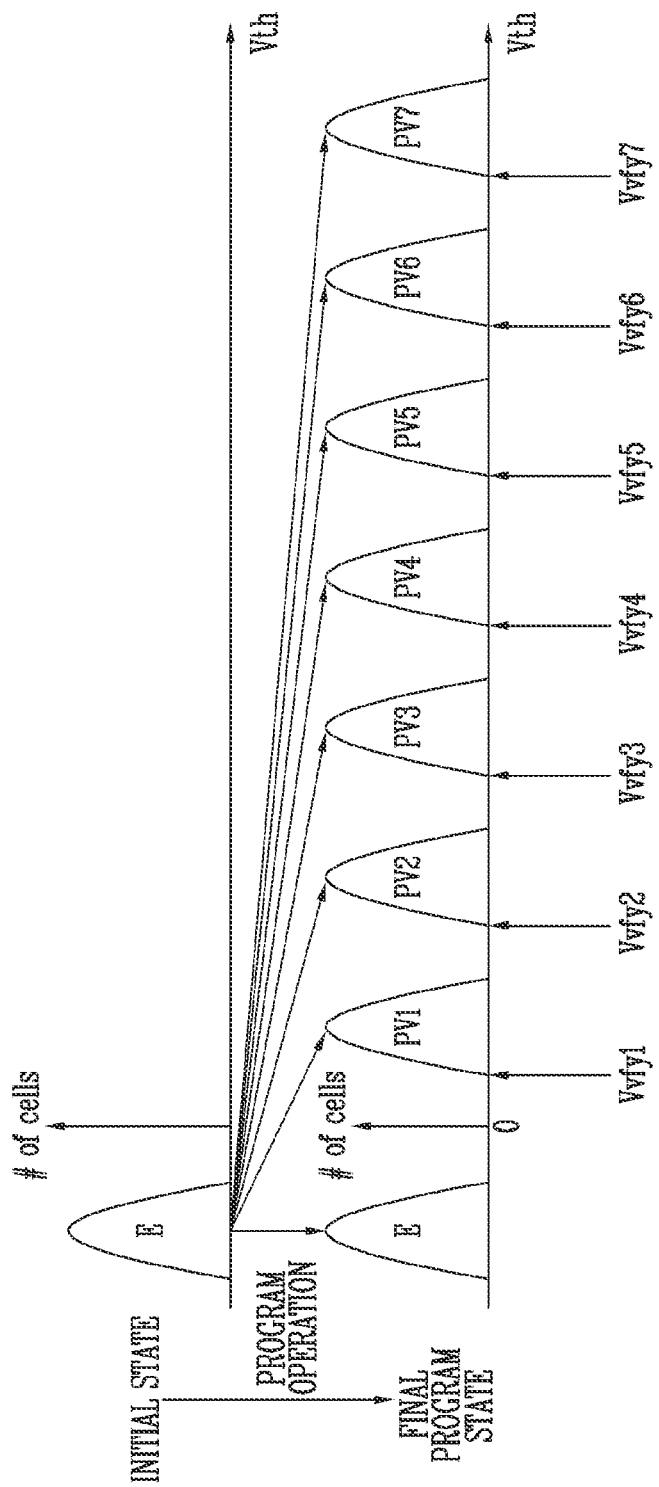
FIG. 4 is a diagram illustrating threshold voltage distributions of memory cells based on a program operation of a memory device.

FIG. 4 is a diagram illustrating threshold voltage distributions of memory cells based on a program operation of a memory device.

In FIG. 4, the horizontal axis of a graph indicates threshold voltages Vth of memory cells, and the vertical axis of the graph indicates the number of memory cells (# of cells).

Referring to FIG. 4, the threshold voltage distributions of memory cells may be changed from an initial state to a final program state based on the program operation.

In FIG. 4, a description is made on the assumption that data is programmed according to a TLC scheme in which one memory cell stores three bits of data.

The initial state may be a state in which a program operation is not performed and in which the threshold voltage distributions of memory cells are in an erase state E.

The final program state may be the threshold voltage distribution of memory cells on which a program operation is performed. Each of the memory cells on which the program operation is performed may have a threshold voltage corresponding to any one of a plurality of program states. For example, when data is programmed according to a triple-level cell (TLC) scheme in which three bits of data are stored in one memory cell, the plurality of program states may indicate the erased state E and first to seventh program states PV1 to PV7. In an embodiment, each of the memory cells on which the program operation is performed may have a threshold voltage corresponding to the erased state E or any one of the first to seventh program states PV1 to PV7. The threshold voltage of each memory cell in the initial state may be increased to the threshold voltage corresponding to the erased state E or any one of the first to seventh program states PV1 to PV7 through the program operation.

Each memory cell may have the erased state E or any one of the program states PV1 to PV7 as a target program state.

The target program state may be determined based on the data to be stored in the corresponding memory cell. Each memory cell may have a threshold voltage corresponding to the target program state, among the final program states, through the corresponding program operation.

In an embodiment, the memory device 100 may perform a verify operation of identifying whether the threshold voltages of memory cells have reached threshold voltages corresponding to target program states. The memory device 100 may identify the threshold voltages of the memory cells by sensing currents that flow through bit lines that are coupled to the memory cells when the verify voltage is applied to a word line that is coupled to the memory cells. For example, the memory device 100 may perform a verify operation by applying the first verify voltage Vvfy1 to memory cells having the first program state PV1 as a target program state. The first verify voltage Vvfy1 may be a threshold voltage corresponding to the first program state PV1. When the threshold voltages of the memory cells having the first program state PV1 as a target program state are greater than the first verify voltage Vvfy1, the verify operation may pass. When the threshold voltages of the memory cells having the first program state PV1 as a target program state are less than the first verify voltage Vvfy1, the verify operation may fail. Similarly, the memory device 100 may perform the verify operation by applying second to seventh verify voltages Vvfy2 to Vvfy7 to memory cells having second to seventh program states PV2 to PV7 as target program states.

Figure 5:
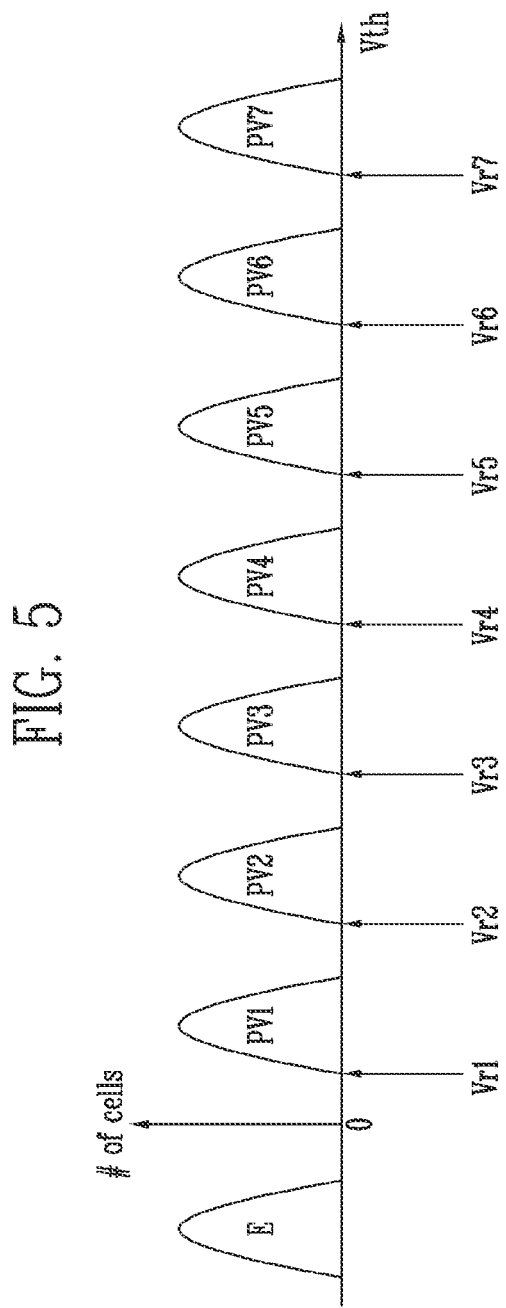
FIG. 5 is a diagram illustrating a read operation of the memory device.

FIG. 5 is a diagram illustrating a read operation of the memory device.

In FIG. 5, a description is made on the assumption that data is programmed according to a TLC scheme in which one memory cell stores three bits of data. Referring to FIG. 5, the threshold voltage of each of a plurality of memory cells may be increased to a threshold voltage corresponding to any one of an erased state E and first to seventh program states PV1 to PV7 through a program operation. Thereafter, the memory device 100 may perform a read operation of acquiring data that is stored in the memory cells. In detail, when a read voltage is applied to a word line that is coupled to selected memory cells, among the plurality of memory cells, the memory device 100 may sense data that is stored in the selected memory cells by detecting currents that are changed on the bit lines that are coupled to the selected memory cells. The data that is stored in the memory cells may vary based on the program states of the memory cells. In detail, different pieces of data may be stored based on any of the erased state E and the first to seventh program states PV1 to PV7 to which the threshold voltage of each memory cell corresponds. Therefore, the memory device 100 may acquire data by applying a first read voltage Vr1 to a memory cell in which data corresponding to the first program state PV1 is stored. The first read voltage Vr1 may be a voltage for distinguishing the erased state E from the first program state PV1. Similarly, the memory device 100 may acquire pieces of data that is stored in the plurality of memory cells by using second to seventh read voltages Vr2 to Vr7. The memory device 100 may apply read voltages Vr1 to Vr7 having different magnitudes to the plurality of memory cells based on the program states to which the threshold voltages of the plurality of memory cells correspond during a read operation.

Figure 6:
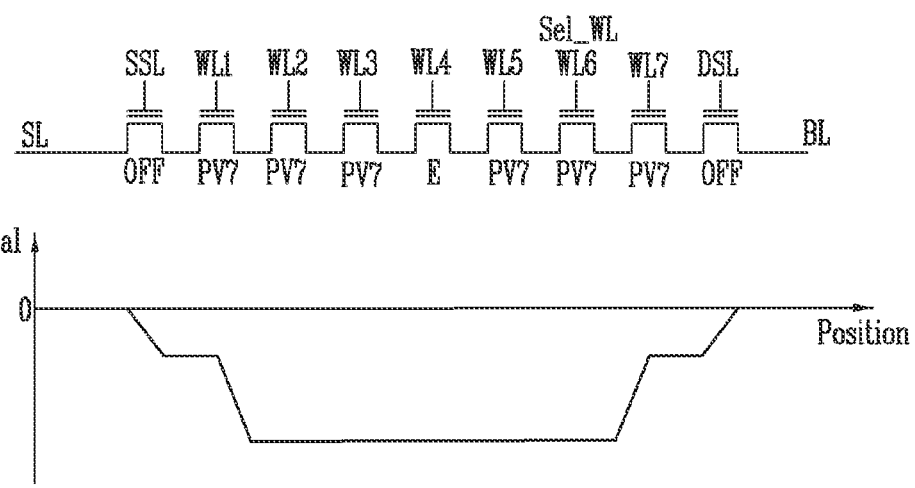
FIG. 6 is a diagram illustrating a channel potential changed in a program operation and a read operation.

FIG. 6 is a diagram illustrating a channel potential changed in a program operation and a read operation.

In FIG. 6, a horizontal axis denotes the positions of transistors coupled between a source line SL and a bit line BL, and a vertical axis denotes a channel potential.

In FIG. 6, for convenience of description, a description will be made on the assumption that seven word lines WL1 to WL7 are coupled to one memory cell string. However, the embodiment is not limited thereto and may have more word lines or less word lines.

The channel potential illustrated in FIG. 6 may be the channel potential that has changed after the termination of a program voltage apply operation, a verify operation, and a read operation. The program voltage apply operation may be an operation that applies a program voltage to a selected word line and applies a program pass voltage to unselected word lines. The verify operation may be an operation that applies a verify voltage to a selected word line and applies a verify pass voltage to unselected word lines. The read operation may be an operation that applies a read voltage to a selected word line and applies a read pass voltage to unselected word lines.

The memory device 100 may perform a discharge operation that decreases voltages of a plurality of word lines after the program voltage apply operation, the verify operation, and the read operation have been terminated. For example, the memory device 100 may perform a discharge operation that applies a ground voltage to the plurality of word lines after the program voltage apply operation, the verify operation, and the read operation have been terminated. During the discharge operation, transistors that are coupled to a source select line SSL and a drain select line DSL may be turned off. During the discharge operation, the voltage of the word line that is coupled to memory cells in a program state may first be discharged to the ground voltage. Further, memory cells corresponding to higher program states, among the plurality of program states, may have higher threshold voltages. For example, when one memory cell is programmed according to a TLC scheme, memory cells that are programmed to a seventh program state PV7 may have the highest threshold voltage. Further, as the voltages of word lines are decreased during the discharge operation, memory cells having higher threshold voltages are first decreased to a voltage lower than the threshold voltages, and thus, channels that correspond to the memory cells having higher threshold voltages may be cut off first. For example, as illustrated in FIG. 6, when a first memory cell and a second memory cell that are respectively coupled to the first word line WL1 and the seventh word line WL7 that are located in an outermost portion in relation to the memory cell string, among the plurality of word lines WL1 to WL7, are programmed to the seventh program state PV7, channels corresponding to the first memory cell and the second memory cell may be cut off first during a discharge operation. Thereafter, charges in a cut-off channel interval may undergo negative down-coupling, and thus, all the potentials of channels that are coupled to the memory cell string may be decreased to a negative state. A phenomenon in which the potential of each channel that is coupled to a memory cell string is decreased to a negative state during a discharge operation is referred to as "negative boosting." That is, disturbances may occur in which, as the potential of each channel that is coupled to the memory cell string is maintained in a negative state during the discharge operation, the threshold voltages of memory cells vary. When the first memory cell and the second memory cell that are respectively coupled to the first word line WL1 and the seventh word line WL7 that are located in the outermost portion in relation to the memory cell string, among the plurality of word lines WL1 to WL7, are programmed to the highest program state, such disturbances may become severe.

Figure 7:
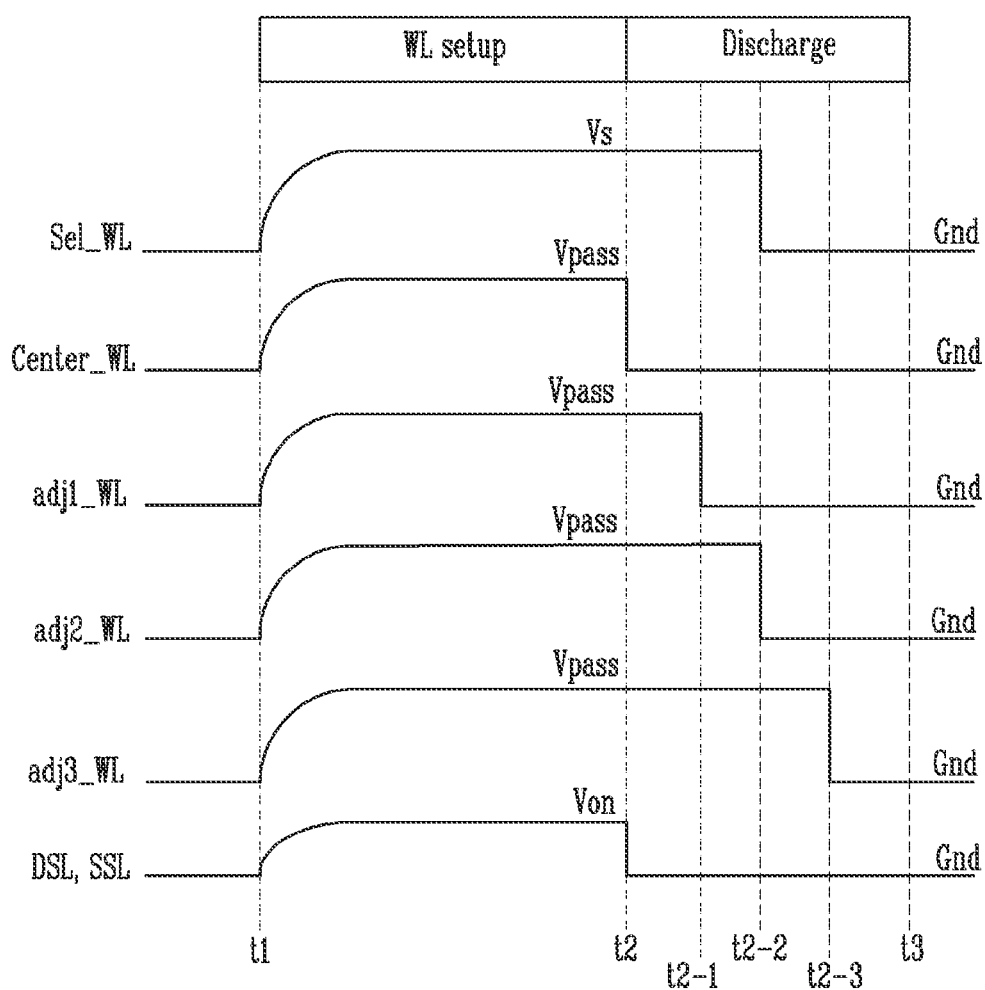
FIG. 7 is a diagram illustrating a discharge operation according to an embodiment of the present disclosure.

FIG. 7 is a diagram illustrating a discharge operation according to an embodiment of the present disclosure.

In the discharge operation (Discharge) illustrated in FIG. 7, the plurality of word lines WL1 to WL7 illustrated in FIG. 6 will be described by way of example.

Referring to FIG. 7, the memory device 100 may perform a word line setup operation (WL Setup) and a discharge operation (Discharge). The word line setup operation (WL setup) may be any one of a program voltage apply operation, a verify operation, and a read operation. In an embodiment, when the word line setup operation (WL setup) is the program voltage apply operation, the verify operation may be performed after the discharge operation has been terminated. In an embodiment, when the word line setup operation (WL setup) is the verify operation, the program voltage apply operation may be performed after the discharge operation has been terminated. In an embodiment, when the word line setup operation (WL setup) is the read operation, a subsequent read operation may be performed using a read voltage having a different voltage level compared to a previous read voltage after the discharge operation has been terminated.

During a period from t1 to t2, the memory device 100 may perform a word line setup operation (WL setup). The memory device 100 may apply an operating voltage Vs to a selected word line Sel_WL. The operating voltage Vs may be any one of a program voltage, a verify voltage, and a read voltage. In an embodiment, the memory device 100 may increase the threshold voltages of memory cells that are coupled to the selected word line Sel_WL by applying the program voltage to the selected word line Sel_WL, among a plurality of word lines. In an embodiment, the memory device 100 may identify whether the threshold voltages of memory cells that are coupled to the selected word line Sel_WL have reached threshold voltages corresponding to target program states by applying the verify voltage to the selected word line Sel_WL. In an embodiment, the memory device 100 may sense data that is stored in the memory cells that are coupled to the selected word line Sel_WL by applying the read voltage to the selected word line Sel_WL.

During the period from t1 to t2, the memory device 100 may apply a pass voltage Vpass to unselected word lines other than the selected word line Sel_WL, among the plurality of word lines. The unselected word lines may include a central word line Center_WL, first adjacent word lines adj1_WL, second adjacent word lines adj2_WL, and third adjacent word lines adj3_WL. In an embodiment, when the operating voltage Vs is the program voltage, the voltage of the pass voltage Vpass may be lower than that of the operating voltage Vs. In an embodiment, when the operating voltage Vs is the verify voltage or the read voltage, the voltage of the pass voltage Vpass may be higher than that of the operating voltage Vs. The pass voltage Vpass may be any one of a program pass voltage, a verify pass voltage, and a read pass voltage. In an embodiment, the memory device 100 may apply the program pass voltage to unselected word lines when applying the program voltage to the selected word line Sel_WL. In an embodiment, the memory device 100 may apply the verify pass voltage to unselected word lines when applying the verify voltage to the selected word line Sel_WL. In an embodiment, the memory device 100 may apply the read pass voltage to unselected word lines when applying the read voltage to the selected word line Sel_WL.

During the period from t1 to t2, the memory device 100 may apply a turn-on voltage Von to a drain select line DSL and a source select line SSL. The voltage of the turn-on voltage Von may be higher than that of the threshold voltages of transistors that are coupled to the drain select line DSL and the source select line SSL.

During a period from t2 to t3, the memory device 100 may perform a discharge operation. The voltages of the plurality of word lines Sel_WL, Center_WL, adj1_WL, adj2_WL, and adj3_WL may be decreased to a ground voltage Gnd through the discharge operation.

In detail, during a period from t2 to t2-1, the memory device 100 may apply the ground voltage Gnd to the central word line Center_WL. The central word line Center_WL may be the most centrally located word line, among the plurality of word lines Sel_WL, Center_WL, adj1_WL, adj2_WL, and adj3_WL. For example, in FIG. 6, the central word line Center_WL may be the fourth word line WL4. However, in other embodiments, the number of central word lines may be different. For example, in FIG. 3, the central word line Center_WL may correspond to two word lines, eighth and ninth word lines WL8 and WL9. The memory device 100 may first apply the ground voltage Gnd to the central word line Center_WL during the discharge operation, thus enabling the voltage of the central word line Center_WL to be discharged first.

During the period from t2 to t2-1, the memory device 100 may apply the ground voltage Gnd to the drain select line DSL and the source select line SSL.

During a period from t2-1 to t2-2, the memory device 100 may apply the ground voltage Gnd to the first adjacent word lines adj1_WL. The first adjacent word lines adj1_WL may be word lines that are directly adjacent to both sides of the central word line Center_WL. For example, in FIG. 6, the central word line Center_WL may be the fourth word line WL4, and thus, the first adjacent word lines adj1_WL may correspond to the third word line WL3 and the fifth word line WL5. That is, after applying the ground voltage Gnd to the central word line Center_WL, the memory device 100 may apply the ground voltage Gnd to the first adjacent word lines adj1_WL.

During a period from t2-2 to t2-3, the memory device 100 may apply the ground voltage Gnd to the second adjacent word lines adj2_WL. The second adjacent word lines adj2_WL may be word lines that are directly adjacent to the first adjacent word lines adj1_WL, opposite to the central word line Center_WL. For example, in FIG. 6, the first adjacent word lines adj1_WL may correspond to the third and fifth word lines WL3 and WL5, and thus, the second adjacent word lines adj2_WL may correspond to the second word line WL2 and the sixth word line WL6. Furthermore, as illustrated in FIG. 6, during the period from t2-2 to t2-3, when the sixth word line WL6 is the selected word line Sel_WL, the ground voltage Gnd may be applied to the selected word line Sel_WL. However, unlike this example, the memory device 100 may apply the ground voltage to the selected word line Sel_WL during the period from t2 to t2-1 during which the ground voltage is applied to the central word line. That is, the operation of discharging the selected word line may be performed together with the operation of discharging the central word line Center_WL or may be performed at different time points based on the degree to which the selected word line Sel_WL is adjacent to the central word line Center_WL. After applying the ground voltage Gnd to the first adjacent word lines adj1_WL, the memory device 100 may apply the ground voltage Gnd to the second adjacent word lines adj2_WL.

During a period from t2-3 to t3, the memory device 100 may apply the ground voltage Gnd to the third adjacent word lines adj3_WL. The third adjacent word lines adj3_WL may be word lines that are directly adjacent to the second adjacent word lines adj2_WL, opposite to the first adjacent word lines adj1_WL. For example, in FIG. 6, the second adjacent word lines adj2_WL may correspond to the second word line WL2 and the sixth word line WL6, and thus, the third adjacent word lines adj3_WL may correspond to the first word line WL1 and the seventh word line WL7. After applying the ground voltage Gnd to the second word line adj2_WL, the memory device 100 may apply the ground voltage Gnd to the third adjacent word lines adj3_WL. The third adjacent word lines adj3_WL may be word lines that are directly adjacent to select lines SSL and DSL. That is, the ground voltage Gnd may be applied last to the third adjacent word lines adj3_WL that are directly adjacent to the select lines SSL and DSL.

The voltages of the plurality of word lines may be increased through the word line setup operation (WL setup) and may be decreased through the discharge operation. During the discharge operation, the memory device 100 may sequentially decrease the voltages of the plurality of word lines ranging from the central word line Center_WL to the third adjacent word lines adj3_WL that are directly adjacent to the select lines. In detail, during the discharge operation, the memory device 100 may sequentially apply the ground voltage to the plurality of word lines ranging from the central word line Center_WL to the third adjacent word lines adj3_WL that are directly adjacent to the select lines. The select line may be the drain select line DSL or the source select line SSL.

In an embodiment, the memory device 100 may divide the plurality of word lines into a plurality of word line groups. During the discharge operation, the memory device 100 may sequentially apply the ground voltage to the word line groups that range from a central word line group, among the plurality of word line groups, which is located in a central portion in relation to the memory cell string, to a word line group, among the plurality of word line groups, which is adjacent to the select lines and located in an outermost portion in relation to the memory cell string. Each of the word line groups may include two or more word lines. For example, in FIG. 3, the word line group that is located in the central portion may include seventh to ninth word lines WL7 to WL9.

In accordance with an embodiment of the present disclosure, during the discharge operation, the voltage of the word line that is directly adjacent to a select line may be discharged last to the ground voltage. Accordingly, a phenomenon may be prevented in which a channel is cut off first during the discharge operation even if the threshold voltage of a memory cell that is coupled to the word line that is directly adjacent to the select line is high. Furthermore, because the channel corresponding to the memory cell that is coupled to the word line that is directly adjacent to the select line is not cut off first during the discharge operation, a phenomenon in which negative boosting occurs may be solved.

Figure 8:
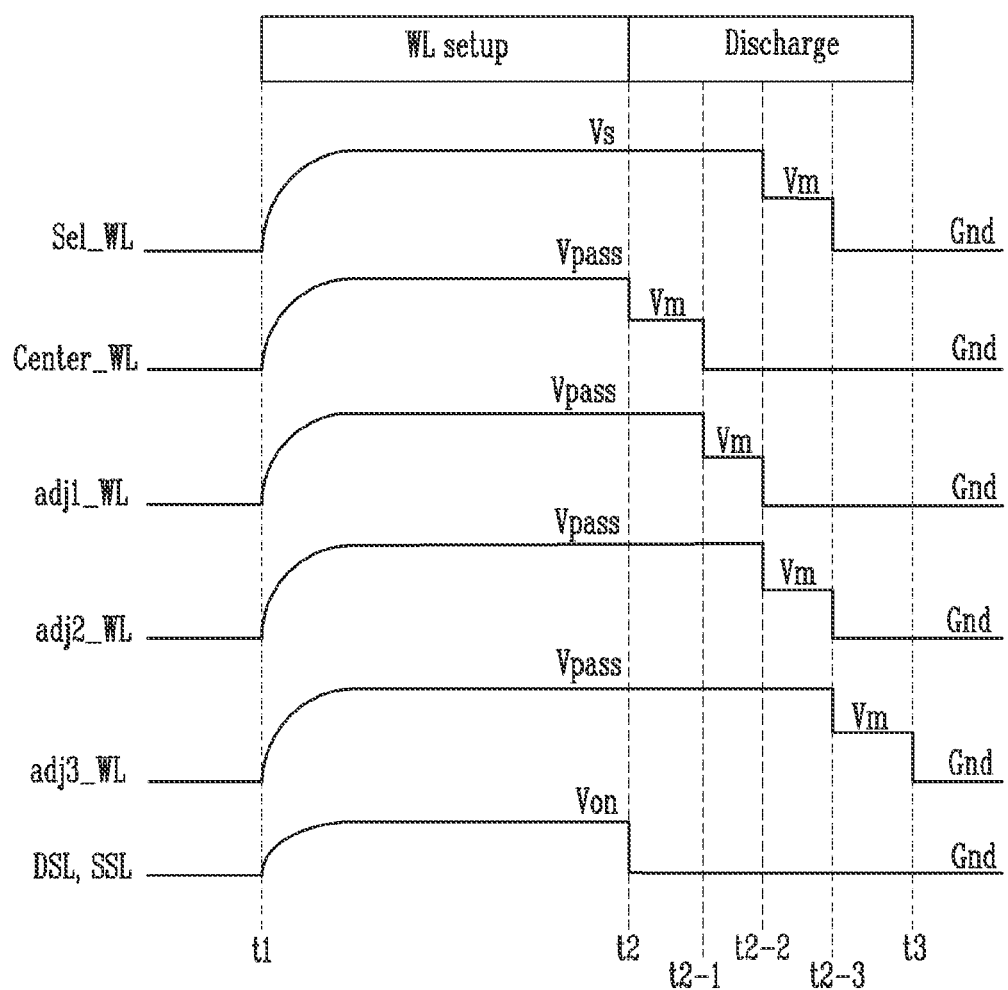
FIG. 8 is a diagram illustrating a first embodiment of a discharge operation according to an embodiment of the present disclosure.

FIG. 8 is a diagram illustrating a first embodiment of a discharge operation according to an embodiment of the present disclosure.

Repeated descriptions of configuration identical to that of FIG. 7 will be omitted in FIG. 8. Referring to FIG. 8, the memory device 100 may perform a word line setup operation (WL Setup) and a discharge operation (Discharge).

During a period from t1 to t2, the memory device 100 may perform the word line setup operation (WL setup). The memory device 100 may apply an operating voltage Vs to a selected word line Sel_WL.

During the period from t1 to t2, the memory device 100 may apply a pass voltage Vpass to unselected word lines other than the selected word line Sel_WL, among a plurality of word lines.

During a period from t2 to t3, the memory device 100 may perform the discharge operation (Discharge). In detail, during a period from t2 to t2-1, the memory device 100 may apply an intermediate voltage Vm to a central word line Center_WL. The intermediate voltage Vm may be a voltage lower than the pass voltage Vpass.

During a period from t2-1 to t2-2, the memory device 100 may apply the ground voltage Gnd to the central word line Center_WL. Also, the memory device 100 may apply the intermediate voltage Vm to first adjacent word lines adj1_WL.

During a period from t2-2 to t2-3, the memory device 100 may apply the ground voltage Gnd to the first adjacent word lines adj1_WL. Further, the memory device 100 may apply the intermediate voltage Vm to second adjacent word lines adj2_WL and the selected word line Sel_WL.

During a period from t2-3 to t3, the memory device 100 may apply the ground voltage Gnd to the second adjacent word lines adj2_WL and the selected word line Sel_WL. Also, the memory device 100 may apply the intermediate voltage Vm to third adjacent word lines adj3_WL.

During a period after t3, the memory device 100 may apply the ground voltage Gnd to the third adjacent word lines adj3_WL.

During the discharge operation, the memory device 100 according to the embodiment of the present disclosure may sequentially apply the intermediate voltage Vm to the word lines that range from the central word line Center_WL to the third adjacent word lines adj3_WL that are directly adjacent to the select lines SSL and DSL and may thereafter apply the ground voltage Gnd thereto.

Figure 9:
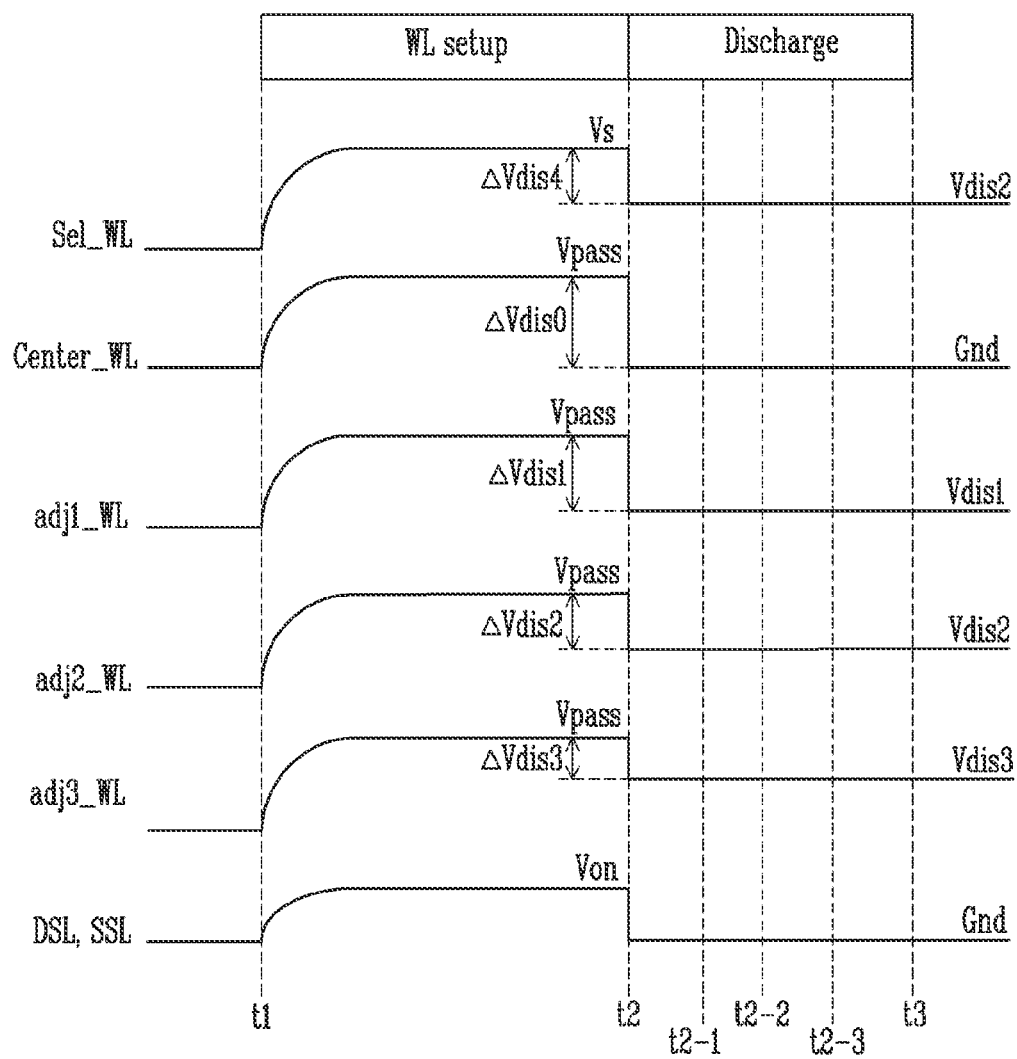
FIG. 9 is a diagram illustrating a second embodiment of a discharge operation according to an embodiment of the present disclosure.

FIG. 9 is a diagram illustrating a second embodiment of a discharge operation according to an embodiment of the present disclosure.

Repeated descriptions of configuration identical to that of FIG. 7 will be omitted in FIG. 9. Referring to FIG. 9, the memory device 100 may perform a word line setup operation (WL Setup) and a discharge operation (Discharge).

During a period from t1 to t2, the memory device 100 may perform the word line setup operation (WL setup). The memory device 100 may apply an operating voltage Vs to a selected word line Sel_WL.

During the period from t1 to t2, the memory device 100 may apply a pass voltage Vpass to unselected word lines other than the selected word line Sel_WL, among a plurality of word lines.

During a period from t2 to t3, the memory device 100 may perform the discharge operation (Discharge). In detail, during a period from t2 to t2-1, the memory device 100 may apply a ground voltage Gnd to a central word line Center_WL. When the voltage of the central word line Center_WL decreases from the pass voltage Vpass to the ground voltage Gnd during the discharge operation, the difference between the magnitudes of the voltages may be a 0-th discharge magnitude ΔVdis0. During the period from t2 to t3, the memory device 100 may also apply a first discharge voltage Vdis1 to first adjacent word lines adj1_WL. The voltage of the first discharge voltage Vdis1 may be higher than that of the ground voltage Gnd. When the voltages of the first adjacent word lines adj1_WL decrease from the pass voltage Vpass to the first discharge voltage Vdis1 during the discharge operation, the difference between the magnitudes of the voltages may be a first discharge magnitude ΔVdis1. The first discharge magnitude ΔVdis1 may be less than the 0-th discharge magnitude ΔVdis0.

During the period from t2 to t3, the memory device 100 may also apply a second discharge voltage Vdis2 to second adjacent word lines adj2_WL and the selected word line Sel_WL. The voltage of the second discharge voltage Vdis2 may be higher than that of the first discharge voltage Vdis1. When the voltage of each of the second adjacent word lines adj2_WL decreases from the pass voltage Vpass to the second discharge voltage Vdis2 during the discharge operation, the difference between the magnitudes of the voltages may be a second discharge magnitude ΔVdis2. The second discharge magnitude ΔVdis2 may be less than the first discharge magnitude ΔVdis1. When the voltage of the selected word line Sel_WL decreases from the operating voltage Vs to the second discharge voltage Vdis2 during the discharge operation, the difference between the magnitudes of the voltages may be a fourth discharge magnitude ΔVdis4. When the operating voltage Vs is the verify voltage or the read voltage, the fourth discharge magnitude ΔVdis4 may be less than the second discharge magnitude ΔVdis2. When the operating voltage Vs is the program voltage, the fourth discharge magnitude ΔVdis4 may be greater than the second discharge magnitude ΔVdis2.

During the period from t2 to t3, the memory device 100 may also apply a third discharge voltage Vdis3 to third adjacent word lines adj3_WL. The voltage of the third discharge voltage Vdis3 may be higher than that of the second discharge voltage Vdis2. When the voltages of the third adjacent word lines adj3_WL decrease from the pass voltage Vpass to the third discharge voltage Vdis3 during the discharge operation, the difference between the magnitudes of the voltages may be a third discharge magnitude ΔVdis3. The third discharge magnitude ΔVdis3 may be less than the second discharge magnitude ΔVdis2.

The memory device 100 according to the embodiment of the present disclosure may apply discharge voltages having different magnitudes to a plurality of word lines during a discharge operation. In detail, the memory device 100 may apply a discharge voltage having a smaller magnitude to a word line that is located closer to the central portion in relation to the memory cell string during the discharge operation. During the discharge operation, the magnitude of the discharge voltage that is applied to each word line may be greater as the word line is closer to a select line.

Figure 10:
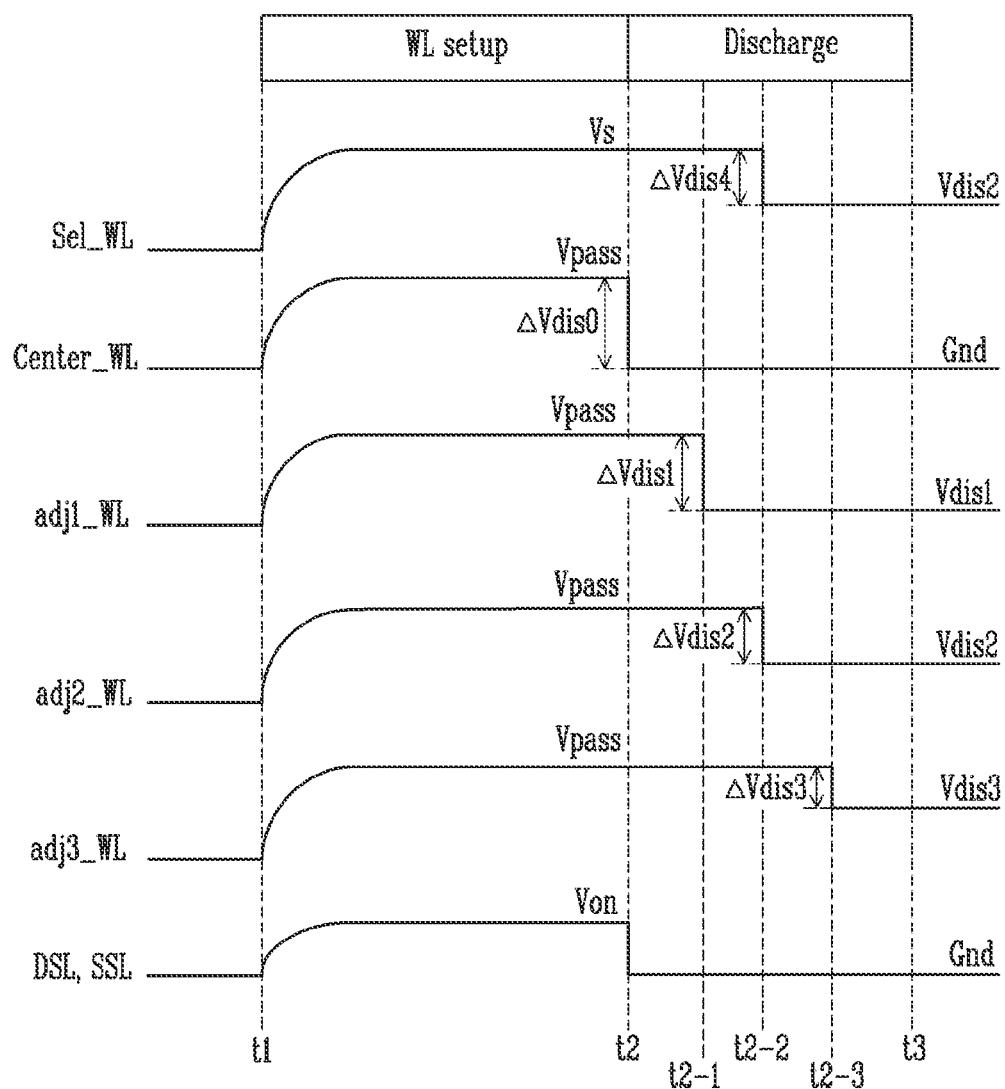
FIG. 10 is a diagram illustrating a third embodiment of a discharge operation according to an embodiment of the present disclosure.

FIG. 10 is a diagram illustrating a third embodiment of a discharge operation according to an embodiment of the present disclosure.

Repeated descriptions of configuration identical to that of FIGS. 7 and 9 will be omitted in FIG. 10. Referring to FIG. 10, the memory device 100 may perform a word line setup operation (WL Setup) and a discharge operation (Discharge).

During a period from t1 to t2, the memory device 100 may perform the word line setup operation (WL setup). The memory device 100 may apply an operating voltage Vs to a selected word line Sel_WL.

During the period from t1 to t2, the memory device 100 may apply a pass voltage Vpass to unselected word lines other than the selected word line Sel_WL, among a plurality of word lines.

During a period from t2 to t3, the memory device 100 may perform the discharge operation (Discharge). In detail, during a period from t2 to t2-1, the memory device 100 may apply a ground voltage Gnd to a central word line Center_WL.

During a period from t2-1 to t2-2, the memory device 100 may apply a first discharge voltage Vdis1 to first adjacent word lines adj1_WL.

During a period from t2-2 to t2-3, the memory device 100 may apply a second discharge voltage Vdis2 to second adjacent word lines adj2_WL and the selected word line Sel_WL.

During a period from t2-3 to t3, the memory device 100 may apply a third discharge voltage Vdis3 to third adjacent word lines adj3_WL. The magnitudes of the first to third discharge voltages Vdis1 to Vdis3 may be set such that, in the same manner as that described with reference to FIG. 9, the third discharge voltage Vdis3 is the highest and the first discharge voltage Vdis1 is the lowest. The voltage of the first discharge voltage Vdis1 may be higher than that of the ground voltage Gnd.

The memory device 100, according to the embodiment of the present disclosure, may sequentially perform a discharge operation in an order starting from at least one central word line, located in a central portion in relation to a memory cell string, and ending with a word line, located in an outermost portion in relation to a memory cell string, which is adjacent to a select line. In this case, the magnitudes of discharge voltages that are applied to the plurality of word lines may be set such that the voltage that is applied to the central word line is the lowest, and the voltage that is applied to the word line that is directly adjacent to the select line is the highest.

Figure 11:
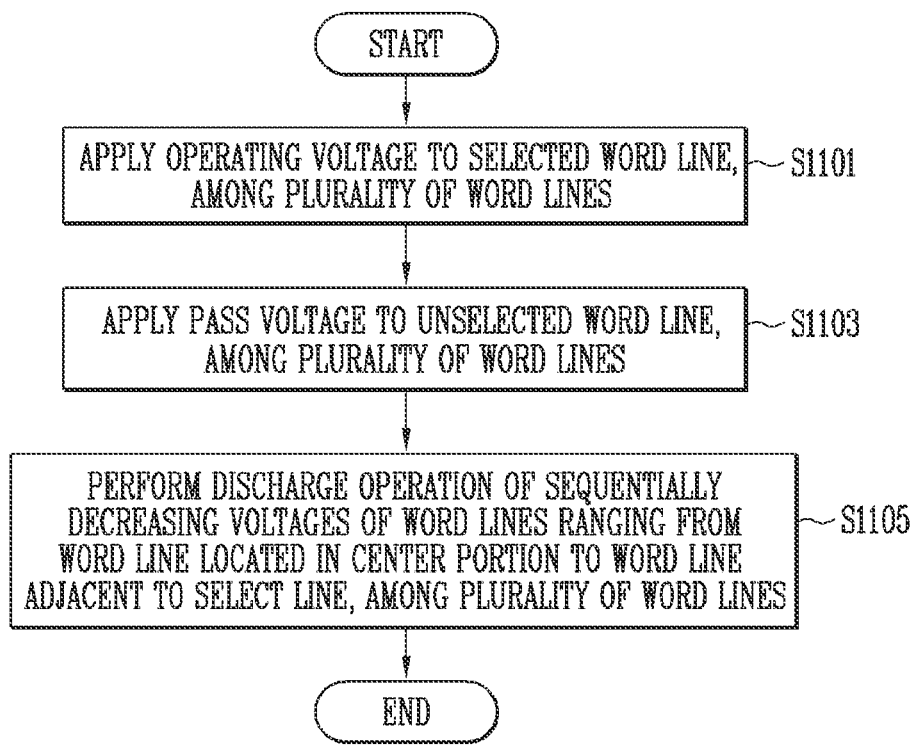
FIG. 11 is a flowchart illustrating a discharge operation according to an embodiment of the present disclosure.

FIG. 11 is a flowchart illustrating a discharge operation according to an embodiment of the present disclosure.

Referring to FIG. 11, at step S1101, the memory device 100 may apply an operating voltage to a selected word line, among a plurality of word lines. The operating voltage may be any one of a program voltage, a verify voltage, and a read voltage.

At step S1103, the memory device may apply a pass voltage to unselected word lines, among the plurality of word lines. The pass voltage may be any one of a program pass voltage, a verify pass voltage, and a read pass voltage. The pass voltage may be a voltage lower than the operating voltage.

At step S1105, the memory device 100 may perform a discharge operation that sequentially decreases the voltages of the plurality of word lines that range from at least one central word line, among the plurality of word lines, located in a central portion in relation to the memory cell string to a word line, among the plurality of word lines, located in an outermost portion in relation to the memory cell string, directly adjacent to a select line. In an embodiment, during the discharge operation, the memory device 100 may sequentially apply a ground voltage to word lines that range from the at least one central word line, located in the central portion in relation to the memory cell string, to the word line, located in an outermost portion in relation to the memory cell string, directly adjacent to the select line.

Figure 12:
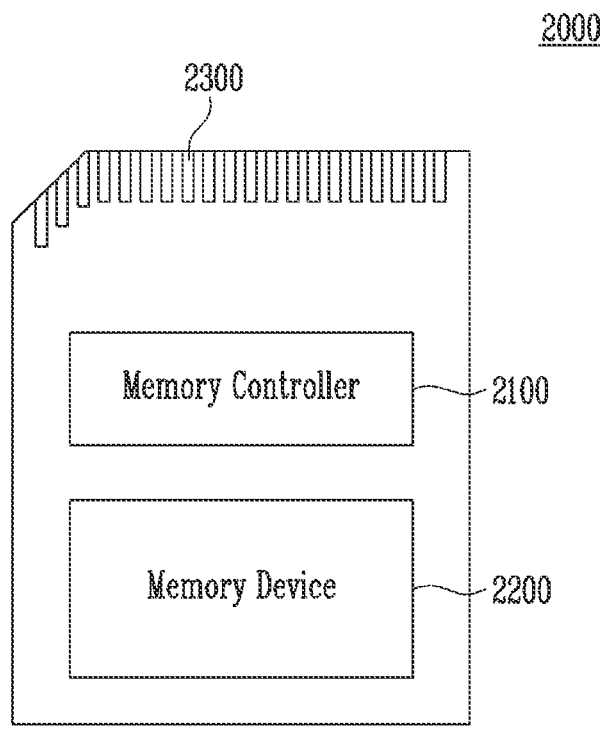
FIG. 12 is a block diagram illustrating a memory card system to which a memory system according to an embodiment of the present disclosure is applied.

FIG. 12 is a block diagram illustrating a memory card system to which a memory system according to an embodiment of the present disclosure is applied.

Referring to FIG. 12, a memory card system 2000 may include a memory controller 2100, a memory device 2200, and a connector 2300.

The memory controller 2100 may be coupled to the memory device 2200. The memory controller 2100 may access the memory device 2200. For example, the memory controller 2100 may control read, write, erase, and background operations of the memory device 2200. The memory controller 2100 may provide an interface between the memory device 2200 and a host. The memory controller 2100 may run firmware for controlling the memory device 2200. The memory controller 2100 may be implemented in the same manner as the memory controller 200, described above with reference to FIG. 1. The memory device 2200 may be implemented in the same manner as the memory device 100, described above with reference to FIG. 1.

In an embodiment, the memory controller 2100 may include components, such as a RAM, a processor, a host interface, a memory interface, and an error correction circuit.

The memory controller 2100 may communicate with an external device through the connector 2300. The memory controller 2100 may communicate with an external device (e.g., a host) based on a specific communication standard or protocol. In an embodiment, the memory controller 2100 may communicate with the external device through at least one of various communication standards or protocols, such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), Wi-Fi, Bluetooth, and nonvolatile memory express (NVMe). In an embodiment, the connector 2300 may be defined by at least one of the above-described various communication standards or protocols.

In an embodiment, the memory device 2200 may be implemented as any of various nonvolatile memory devices, such as an Electrically Erasable and Programmable ROM (EEPROM), a NAND flash memory, a NOR flash memory, a Phase-change RAM (PRAM), a Resistive RAM (Re-RAM), a Ferroelectric RAM (FRAM), a Spin Transfer Torque magnetic RAM (STT-MRAM).

The memory controller 2100 and the memory device 2200 may be integrated into a single semiconductor device to configure a memory card. For example, the memory controller 2100 and the memory device 2200 may be integrated into a single semiconductor device to configure a memory card such as a PC card (personal computer memory card international association: PCMCIA), a compact flash (CF) card, a smart media card (SM or SMC), a memory stick, a multimedia card (MMC, RS-MMC, MMCmicro or eMMC), a SD card (SD, miniSD, microSD, or SDHC), or a universal flash storage (UFS).

Figure 13:
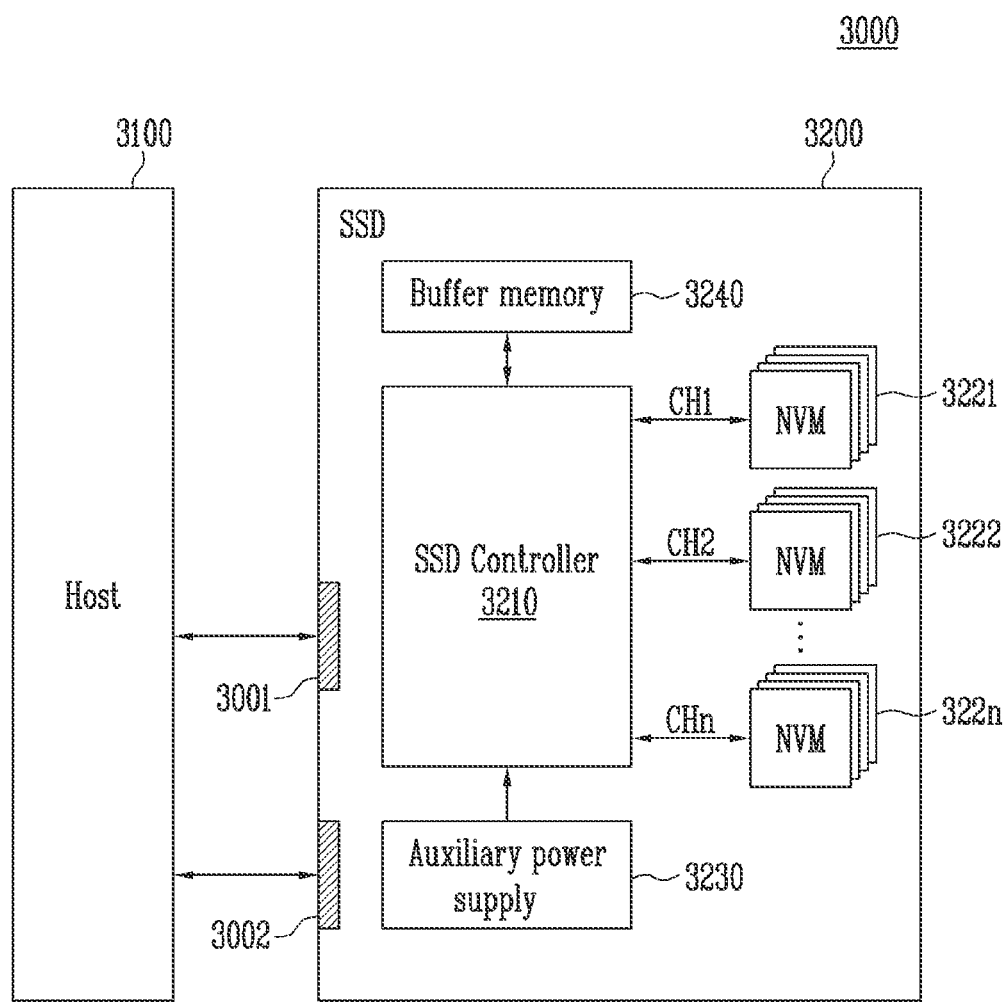
FIG. 13 is a block diagram illustrating a solid state drive (SSD) system to which a memory system according to an embodiment of the present disclosure is applied.

FIG. 13 is a block diagram illustrating a solid state drive (SSD) system to which a memory system according to an embodiment of the present disclosure is applied.

Referring to FIG. 13, an SSD system 3000 may include a host 3100 and an SSD 3200. The SSD 3200 may exchange signals with the host 3100 through a signal connector 3001 and may receive power through a power connector 3002. The SSD 3200 may include an SSD controller 3210, a plurality of flash memories 3221 to 322n, an auxiliary power supply 3230, and a buffer memory 3240.

In accordance with an embodiment of the present disclosure, the SSD controller 3210 may perform the function of the memory controller 200, described above with reference to FIG. 1.

The SSD controller 3210 may control the plurality of flash memories 3221 to 322n in response to the signals that are received from the host 3100. In an embodiment, the signals may be signals based on the interfaces of the host 3100 and the SSD 3200. For example, the signals may be signals defined by at least one of various interfaces, such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power from the host 3100 and may be charged. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 may function as a buffer memory of the SSD 3200. For example, the buffer memory 3240 may temporarily store data that is received from the host 3100 or data that is received from the plurality of flash memories 3221 to 322n or may temporarily store metadata (e.g., mapping tables) of the flash memories 3221 to 322n. The buffer memory 3240 may include volatile memories such as DRAM, SDRAM, DDR SDRAM, LPDDR SDRAM, and GRAM or nonvolatile memories, such as FRAM, ReRAM, STT-MRAM, and PRAM.

Figure 14:
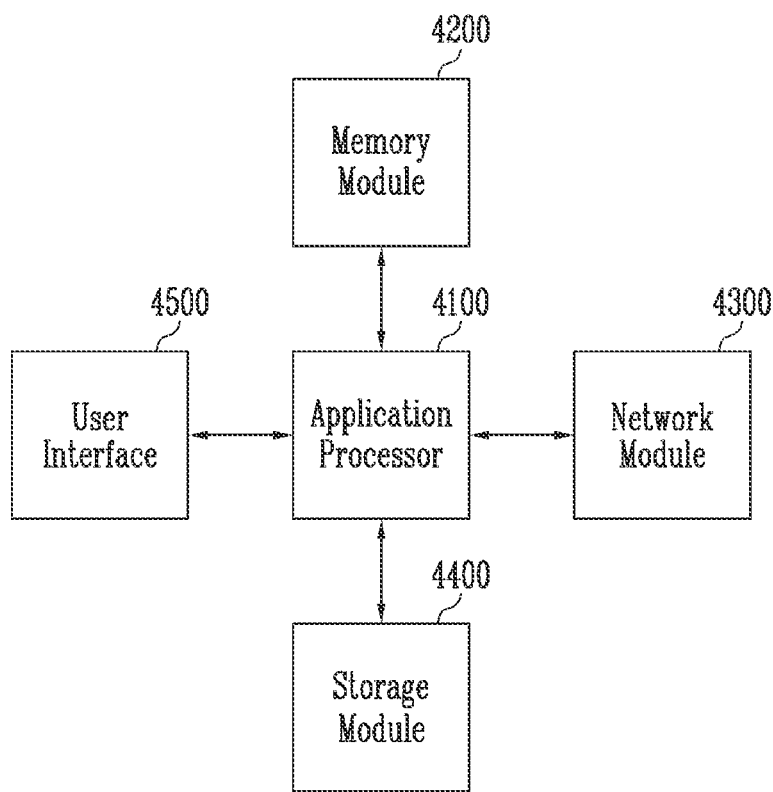
FIG. 14 is a block diagram illustrating a user system to which a memory system according to an embodiment of the present disclosure is applied.

FIG. 14 is a block diagram illustrating a user system to which a memory system according to an embodiment of the present disclosure is applied.

Referring to FIG. 14, a user system 4000 may include an application processor 4100, a memory module 4200, a network module 4300, a storage module 4400, and a user interface 4500.

The application processor 4100 may run components that are included in the user system 4000, an Operating System (OS) or a user program. In an embodiment, the application processor 4100 may include controllers, interfaces, graphic engines, etc. for controlling the components that are included in the user system 4000. The application processor 4100 may be provided as a system-on-chip (SoC).

The memory module 4200 may function as a main memory, a working memory, a buffer memory or a cache memory of the user system 4000. The memory module 4200 may include volatile RAMs, such as DRAM, SDRAM, DDR SDRAM, DDR2 SDRAM, DDR3 SDRAM, LPDDR SDRAM, LPDDR2 SDRAM, and LPDDR3 SDRAM, or the memory module 4200 may include nonvolatile RAMs, such as PRAM, ReRAM, MRAM, and FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), WIMAX, WLAN, UWB, Bluetooth, or Wi-Fi communication. In an embodiment, the network module 4300 may be included in the application processor 4100.

The storage module 4400 may store data. For example, the storage module 4400 may store data that is received from the application processor 4100. Alternatively, the storage module 4400 may transmit the data that is stored in the storage module 4400 to the application processor 4100. In an embodiment, the storage module 4400 may be implemented as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, each of which may be operated in the same manner as the memory device 100, described above with reference to FIG. 1. The storage module 4400 may be operated in the same manner as the memory system 50, described above with reference to FIG. 1.

The user interface 4500 may include interfaces that input data or instructions to the application processor 4100 or output data to an external device. In an embodiment, the user interface 4500 may include user input interfaces, such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces, such as a Liquid Crystal Display (LCD), an Organic Light Emitting Diode (OLED) display device, an Active Matrix OLED (AMOLED) display device, an LED, a speaker, and a monitor.

In accordance with the present disclosure, a memory device is provided that is capable of improving negative boosting during a word line discharge operation, and a method of operating the memory device.

What is claimed is:

1. A memory device, comprising:
   a memory cell string including a plurality of memory cells respectively coupled to a plurality of word lines;
   a peripheral circuit configured to perform an operation that applies an operating voltage to a selected word line, among the plurality of word lines, and applying a pass voltage to unselected word lines, among the plurality of word lines; and
   an operation controller configured to control the peripheral circuit to perform, after the operation has been performed, a discharge operation that sequentially decreases voltages of the plurality of word lines in a direction from at least one central word line among the plurality of word lines to a first outermost word line adjacent to a first select line and in a direction from the at least one central word line to a second outermost word line adjacent to a second select line,
   wherein threshold voltages of memory cells, among the plurality of memory cells, coupled to the first outermost word line and the second outermost word line, are higher than a threshold voltage of a memory cell, among the plurality of memory cells, coupled to the at least one central word line that is located in a central portion in relation to the memory cell string.

2. The memory device according to claim 1, wherein the operation controller is configured to control the peripheral circuit to apply a ground voltage to the first select line and the second select line during the discharge operation.

3. The memory device according to claim 2, wherein the operation controller is configured to control the peripheral circuit to apply, during the discharge operation, the ground voltage to the plurality of word lines.

4. The memory device according to claim 3, wherein the operation controller is configured to control the peripheral circuit to apply, after a discharge voltage that is lower than the pass voltage has been applied to the plurality of word lines for a preset time, the ground voltage to the plurality of word lines.

5. The memory device according to claim 2, wherein the operation controller is configured to control the peripheral circuit to apply, during the discharge operation, a first discharge voltage to the at least one central word line and a second discharge voltage that is higher than the first discharge voltage to first word lines that are directly adjacent to the at least one central word line.

6. The memory device according to claim 5, wherein the operation controller is configured to control the peripheral circuit to apply a third discharge voltage that is higher than the second discharge voltage to second word lines that are directly adjacent to the first word lines, opposite to the at least one central word line.

7. The memory device according to claim 6, wherein the discharge voltage that is applied to each of the plurality of word lines is higher the farther each of the plurality of word lines is from the at least one central word line.

8. The memory device according to claim 1, wherein:
   the operating voltage is a sensing voltage that is lower than the pass voltage, and
   the operation is a sensing operation that identifies a threshold voltage of a selected memory cell that is coupled to the selected word line.

9. The memory device according to claim 1, wherein:
   the operating voltage is a program voltage that is higher than the pass voltage, and
   the operation is a program voltage apply operation that increases threshold voltages of the plurality of memory cells.

10. A method of operating a memory device, comprising:
    applying an operating voltage to a selected word line, among a plurality of word lines that are coupled to a plurality of memory cells included in a memory cell string;
    performing an operation that applies a pass voltage to unselected word lines, among the plurality of word lines; and
    performing, after the operation has been performed, a discharge operation that sequentially decreases voltages of the plurality of word lines in a direction from at least one central word line among the plurality of word lines to a first outermost word line adjacent to a first select line and in a direction from the at least one central word line to a second outermost word line adjacent to a second select line,
    wherein threshold voltages of memory cells, among the plurality of memory cells, coupled to the first outermost word line and the second outermost word line, are higher than a threshold voltage of a memory cell, among the plurality of memory cells, coupled to the at least one central word line that is located in a central portion in relation to the memory cell string.

11. The method according to claim 10, wherein a ground voltage is applied to the first select line and the second select line during the discharge operation.

12. The method according to claim 11, wherein performing the discharge operation comprises:
applying the ground voltage to the plurality of word lines.

13. The method according to claim 12, wherein performing the discharge operation further comprises:
applying the ground voltage to the plurality of word lines after applying a discharge voltage that is lower than the pass voltage to the plurality of word lines for a preset time.

14. The method according to claim 11, wherein performing the discharge operation further comprises:
applying a first discharge voltage to the at least one central word line, and
applying a second discharge voltage that is higher than the first discharge voltage to first word lines that are directly adjacent to the at least one central word line.

15. The method according to claim 14, wherein performing the discharge operation further comprises:
applying a third discharge voltage that is higher than the second discharge voltage to second word lines that are directly adjacent to the first word lines, opposite to the at least one central word line.

16. The method according to claim 15, wherein the discharge voltage that is applied to each of the plurality of word lines is higher the farther each of the plurality of word lines is from the at least one central word line.

17. The method according to claim 10, wherein:
the operating voltage is a sensing voltage that is lower than the pass voltage, and
the operation is a sensing operation that identifies a threshold voltage of a selected memory cell that is coupled to the selected word line.

18. The method according to claim 10, wherein:
the operating voltage is a program voltage that is higher than the pass voltage, and
the operation is a program voltage apply operation that increases threshold voltages of the plurality of memory cells.

* * * * *